United States Patent [19]
Tseng et al.

[11] Patent Number: 6,166,582
[45] Date of Patent: Dec. 26, 2000

[54] METHOD AND APPARATUS OF AN OUTPUT BUFFER FOR CONTROLLING THE GROUND BOUNCE OF A SEMICONDUCTOR DEVICE

[75] Inventors: Jiunn-Chin Tseng, Tainan; Howard Clayton Kirsch, Taoyuan, both of Taiwan

[73] Assignee: Vanguard International Semiconductor Corporation, Hsinchu, Taiwan

[21] Appl. No.: 09/189,439

[22] Filed: Nov. 10, 1998

[51] Int. Cl.[7] .............................. H03K 5/12; H03K 17/16
[52] U.S. Cl. .......................... 327/384; 327/387; 327/388; 327/380
[58] Field of Search ..................................... 327/379, 384, 327/437, 380, 387, 389, 391; 326/33, 27

[56] References Cited

U.S. PATENT DOCUMENTS 5,254,890  10/1993  Wang et al. .............................. 327/384

Primary Examiner—Dinh T. Le
Attorney, Agent, or Firm—Christensen O'Connor Johnson Kindness PLLC

[57] ABSTRACT

A method and apparatus of an output buffer for controlling the ground bounce and power supply noise during output switching is provided. A CMOS output buffer comprises a P-channel output transistor, a N-channel output transistor and a predrive circuit. During output pull-down transition, the predrive circuit generates a first gate voltage on the pull-down N-channel output transistor for a predetermined time, and further generates a second voltage value which is smaller than the first voltage value, then returns to the first voltage value after the elapse of the predetermined time. The predrive circuit makes the pull-down N-channel output transistor stay in the saturation region longer than the uncontrolled scheme, the steep rising gate voltage on the N-channel output transistor can be avoided with a very little speed degradation but instead of better ground bounce improvement. During output pull-up transition, the predrive circuit generates a first gate voltage on the pull-up P-channel output transistor for a predetermined time, and further generates a second voltage which is higher than the first voltage value, then returns back to the first voltage value after the elapse of the predetermined time.

9 Claims, 13 Drawing Sheets

METHOD AND APPARATUS OF AN OUTPUT BUFFER FOR CONTROLLING THE GROUND BOUNCE OF A SEMICONDUCTOR DEVICE

FIELD OF THE INVENTION

This invention relates to a circuit of an output buffer of a semiconductor device for controlling the ground bounce phenomenon, and particularly to the semiconductor memory device output buffer circuits for controlling the charge and discharge current of an output buffer to reduce the ground bounce noise.

BACKGROUND OF THE INVENTION

Ground bounce problems are prevalent in the design of integrated circuits such as a semiconductor memory device. Noises induced by output buffers of an integrated circuit is common and increases the degree of ground bounce. Transistors of large size, which are included in the output buffer circuit and the package inductance, in particular, cause ground bounce phenomenon.

FIG. 1A shows the configuration of coupling a sending chip 100 to a receiving chip 101. If there are n drivers switching from a high state to a low state and a non-switching driver is holding an output at a low state, a discharge current $n \cdot I_{dis}$ flow through the ground terminal of the sending chip 100. The change of electrical current induces a voltage $V_L$ at the inductance L of the ground path which raises the chip internal ground potential, as the relationship between the variables are represented by the following equation:

$$V_L = n \cdot L \frac{d I_{dis}}{d t} \quad (1)$$

The condition described above may cause several effects. First, the signal at the output of the switching driver will be delayed due to the drop of the effective power supply voltage. Thus, the output signal becomes valid later. Second, a disturbance signal will be coupled to the output of the non-switching driver. The disturbance can exceed the threshold voltage of the receiver chip 101. Third, the resulting fluctuation of the chip internal power supply and ground potential can cause malfunction of a chip internal logic. Last, the undershoots at the outputs can damage the input circuit of the receiver chip 101.

In FIG. 1B, there is shown a prior art circuit diagram of a conventional CMOS output buffer. The output buffer circuit includes a pull-up transistor device 110, and a pull-down transistor device 111, connected in series between the internal power supply node and internal ground potential node. There are three package inductors Lp 112, Lg 113 and Ld 114.

In FIG. 1C, there is shown a prior art circuit diagram for a conventional NMOS output buffer. The NMOS output buffer includes a pull-up transistor device 120, and a pull-down transistor device 121, connected in series between the internal power supply node and internal ground potential node. To produce a full $V_{dd}$ output high logic level signal at the output terminal, the pull-up N-channel output transistor 120 must receive a boosted gate signal at least one transistor threshold value above $V_{dd}$ supply voltage.

The semiconductor memory device employs a byte-wide memory scheme for accessing more data during one operation cycle, and therefore, a plurality of output buffers are simultaneously enabled to realize the byte-wide output organization. Accordingly, since a plurality of output buffer is simultaneously operated, the problems caused by ground bounce become more severe. Two different output drive design methodologies are often used in the design of integrated circuits: 1) current controlled output driver, and 2) controlled slew rate output driver. Simulations have demonstrated that the use of a current controlled output driver degrades the switching speed for clock frequencies of 30 MHz or greater. The objective of a controlled slew rate output driver is to control the output driver's rise and fall times in order to control the ground bounce (di/dt) noise. It is the objective of the invention to provide a controlled slew rate output driver circuit in order to reduce ground bounce noise.

SUMMARY OF THE INVENTION

Apparatus for controlling the ground bounce phenomenon of a semiconductor device. The semiconductor device includes a first transistor being connected to the voltage of a first supply, and a second transistor being connected to the voltage of a second supply. The semiconductor device is set high impedance when an output enable signal fed to the apparatus is at the voltage level of the second supply. The apparatus mentioned above including a predriving means.

The predriving means is to generate a first control signal and a second control signal. Wherein the first control signal is used to extend the duration that the first transistor keeps in saturation when an data input signal of the apparatus changes from a second voltage level to a first voltage level. The second control signal is used to extend the duration that the second transistor keeps in saturation when the data input signal of the apparatus changes from the first voltage level to the second voltage level. The data input signal being at the first voltage level for a first period, whereas the data input signal being at the second voltage level for a second period.

An MOS DRAM memory device includes an output buffer having an P-channel output transistor, and N-channel output transistor and a predrive circuit. For pull-down transition, the pull-down N-channel output transistor controls the discharge of an output signal. To reduce ground bounce during the output signal pull-down transition, a controlled gate voltage of the pull-down N-channel output transistor is generated in response to a data input signal.

During output pull-down transition, the predrive circuit generates a first gate voltage on the pull-down N-channel output transistor for a predetermined time, and further genareates a second voltage value which is smaller than the first voltage, then return to the first voltage value after the elapse of the predetermined time. The predrive circuit makes the pull down N-channel output transistor stay in the saturation region longer than the uncontrolled scheme, the steep rising gate voltage on the N-channel output transistor can be avoided with a very small speed degradation but instead of better ground bounce improvement. With the same concept mentioned above, such control scheme is also applied to pull-up P-channel output transistor, MPU. During output pull-up transition, the predrive circuit generates a first gate voltage on the pull-up P-channel output transistor for a predetermined time, and further generates a second voltage value which is higher than the first voltage, then returns to the first voltage value after the elapse of the predetermined time. Besides, such concept to control power/ground bounce effect can be applied to bipolar or BiCMOS output buffer design too.

BRIEF DESCRIPTION OF THE DRAWINGS

The above features of the present invention will be more clearly understood from consideration of the following descriptions in connection with accompanying drawings in which.

DETAILED DESCRIPTION OF THE PREFERRED EMBODIMENT

The objective of a controlled slew rate output driver is to control the output driver's rise and fall times in order to control ground bounce (di/dt) noise. To achieve the concept mentioned above, the gate voltages of a pair of pull-up and pull-down output transistors are specifically controlled in the following manner.

Figure 1A:
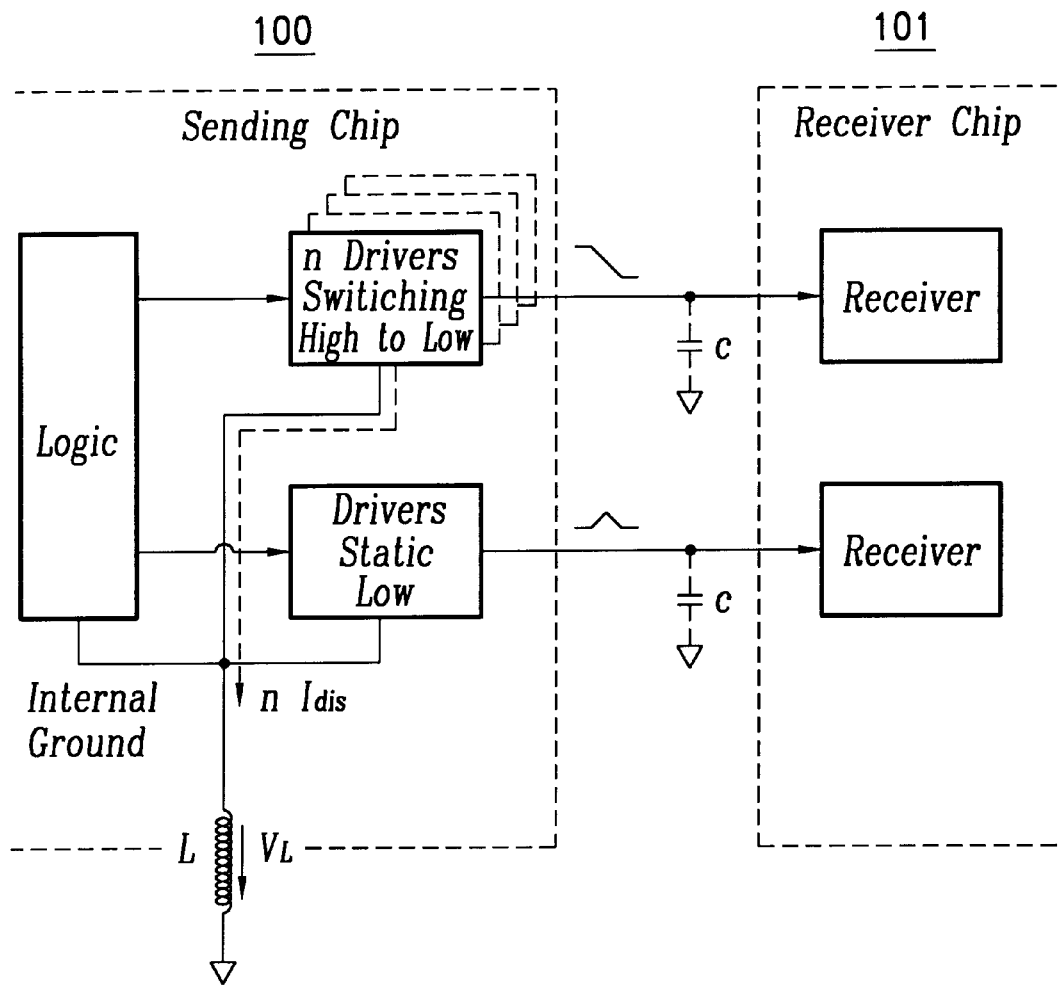
FIG. 1A shows the configuration including two chips connected to each other.
Figure 1B:
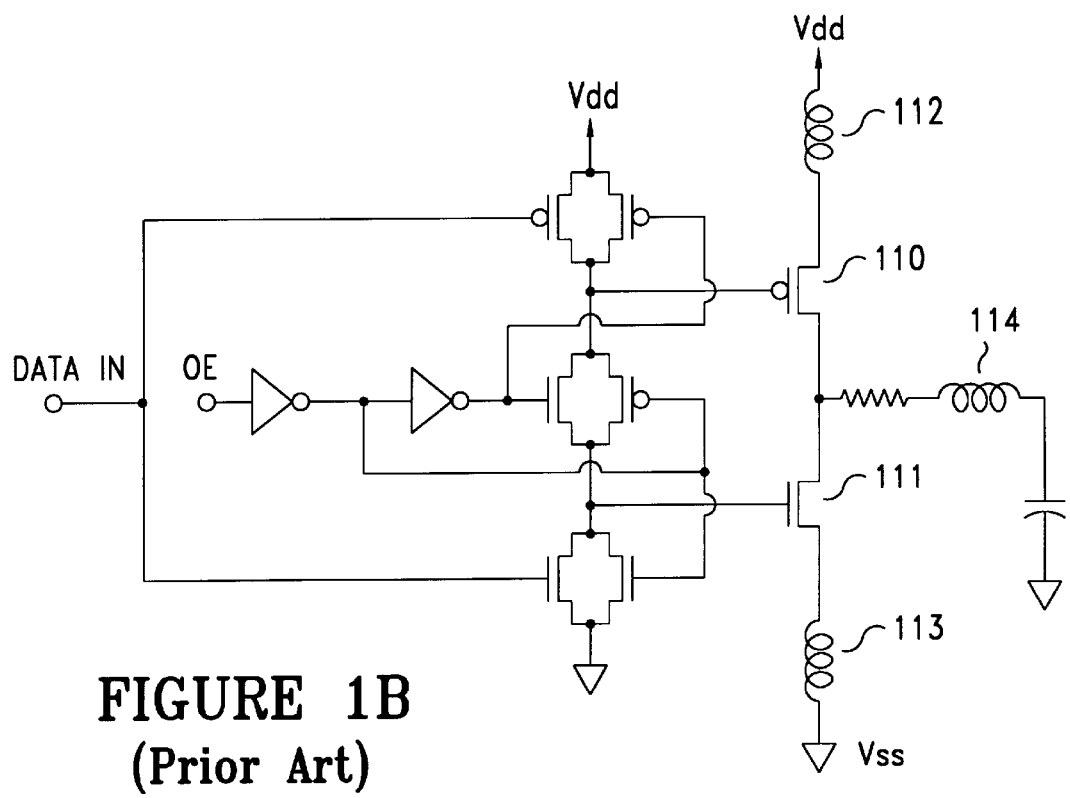
FIG. 1B shows a circuit diagram of a prior art for a conventional CMOS output buffer.
Figure 1C:
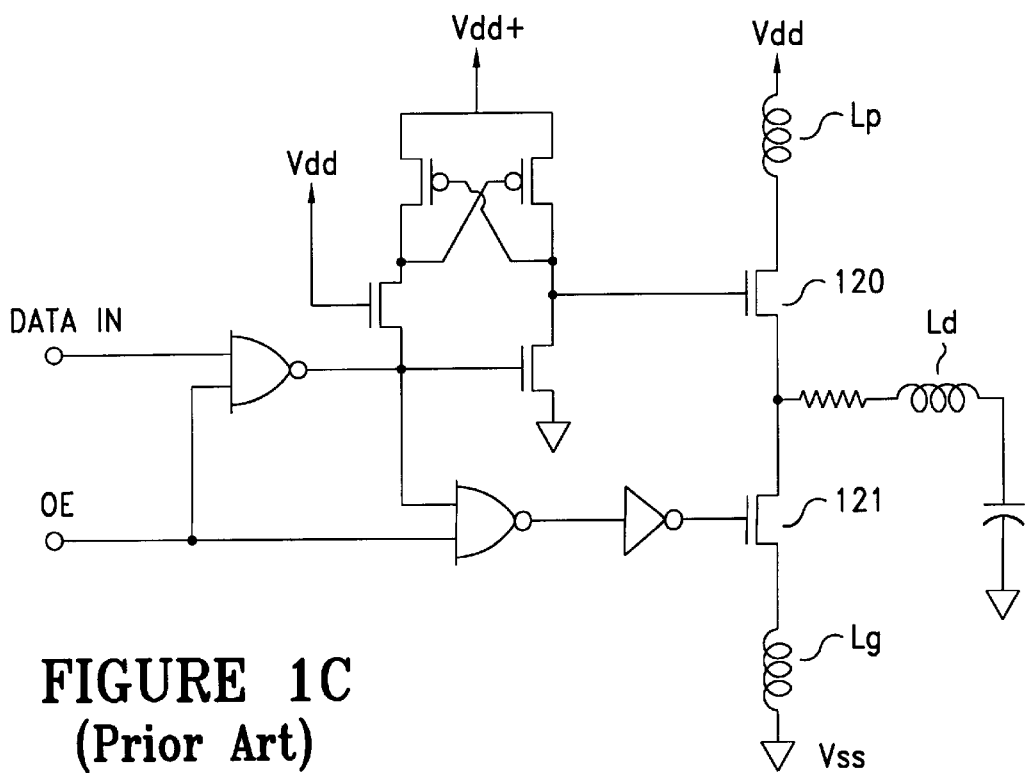
FIG. 1C shows a circuit diagram of a prior art for a conventional NMOS output buffer.
Figure 2A:
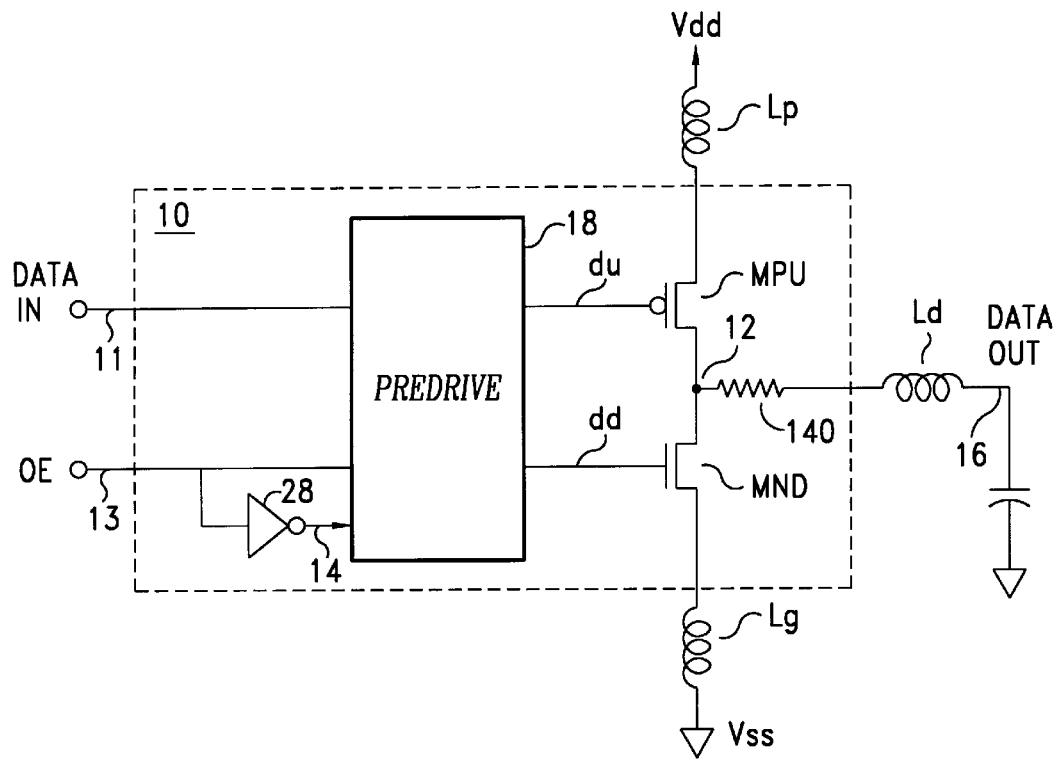
FIG. 2A is an CMOS output buffer circuit of the present invention.

Referring to FIG. 2A, an CMOS output buffer circuit 10 of the invention. A logic data input 11 is the data output from a selected bit of a memory array. An output 12 of the buffer circuit 10 is used to drive an output pad and pin of an integrated circuit package. A P-channel output driver transistor MPU and a N-channel output driver transistor MND are used to drive the output node 12. The P-channel transistor MPU is a pull-up transistor and the N-channel transistor MND is a pull-down transistor, forcing the intermediate node 12 to either $V_{dd}$ via transistor MPU or ground, $V_{ss}$, via transistor MND. The gate of the transistor MPU and MND are driven by separate signals produced by a predrive circuit 18 shown in FIG. 4A. If the output 12 is desired to have a logic "1" state, the predrive circuit 18 would pull down gate du to its first voltage (e.g., $V_{ss}$) to turn on pull-up P-channel transistor MPU, while the gate of MND is kept at $V_{ss}$ to turn off transistor MND.

Figure 2B:
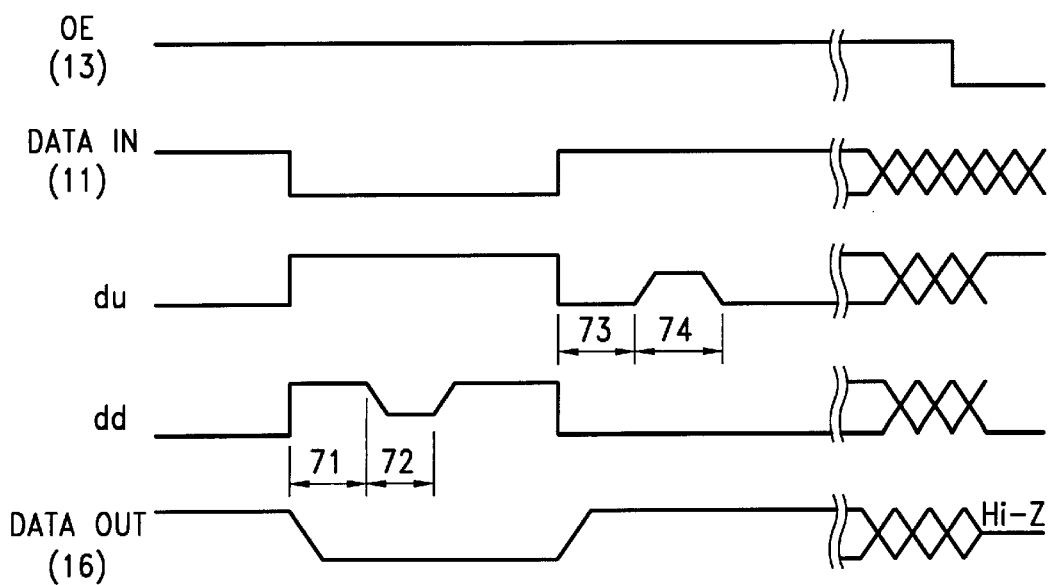
FIG. 2B is the waveform of the OE, DATA IN, du, dd and DATA OUT terminals.

The waveforms of the OE, DATA IN, du, dd and DATA OUT terminals is shown in FIG. 2B. But for ground bounce improvement, after a predetermined time 73, the predrive circuit 18 would generate the second voltage value which is larger than first voltage (e.g., $V_{ss}$) with a duration period 74 on gate du, and the gate du returns back to its first voltage (e.g., $V_{ss}$). If the output 12 is desired to be a logic "0" state, the predrive circuit 18 turns on N-channel pull-down transistor MND by a positive first voltage (e.g., $V_{dd}$) on the terminal dd, while the gate du is held at $V_{dd}$ to turn off pull-up P-channel transistor MPU. After a predetermined time 71, the predrive circuit 18 generates the second voltage value which is smaller than first voltage on terminal dd, then after a predetermined time 72, the terminal dd returns back to its first voltage (e.g., $V_{dd}$).

The following example uses a pull-down output transition to illustrate the ground bounce control scheme. At a first controlled phase (e.g., Time period 71), the output transistors MND, MPU are driven into conducting and nonconducting states. While the output voltage starts to decrease from $V_{OH}$, the conducting output transistor MND is operating in a saturation region, and the sink current does not reach its maximum during this period. At a second controlled phase (e.g., time period 72), the voltage of terminal dd starts to decrease to a second smaller value, so the gate-to-source voltage of the conducting output transistor MND is smaller than that in the first phase.

The transistor MND stays in the saturation region until the output voltage $V_O$ is smaller than ($V_{gs}$—$V_{tn}$), where Vgs denotes the gate to source voltage, and Vtn denotes the threshold voltage. The pull-down transistor MND stays in the saturation region longer than the uncontrolled scheme and extends the time to reach the peak sink current Ipeak. Because the output transistor MND stays in the saturation region longer than the uncontrolled scheme, the steep rising voltage of terminal dd can be avoided with a very little speed degradation but instead of better ground bounce improvement. Then, the controlled Ipeak could be smaller than the uncontrolled scheme. For a fixed package inductance, the ground bounce noise is proportional to $|di/dt|_{max,t=t1}$, where $t_1$ denotes the time that the voltage of the terminal dd starts to decrease from its first voltage (e.g., $V_{dd}$).

The induced peak positive ground bounce noise and duration depends on the time period 71 and the predriving circuit of the transistor MND. After the pull-down transistor MND sinks its peak current, the pull-down transistor MND enters the triode region and the conducting current starts to decrease. Due to the second smaller gate-to-source voltage of the output transistor MND, the sink current decreasing rate is well controlled to compensate the positive ground bounce noise induced in the first phase. At the third phase, the voltage of the terminal dd of the transistor MND returns to its first voltage. The output voltage then reaches the $V_{OL}$ value. The pull-up output transition for power bounce control is the same.

The output enable terminal 13, OE, is used to tri-state the output buffer circuit 10. When OE is in a logic "0" state, the gate du is pulled up to $V_{dd}$, then the P-channel output transistor MPU is turned off. The terminal dd is pulled down to $V_{ss}$ to turn off the N-channel output transistor MND. At such occurrence, the output 12 is disconnected from $V_{dd}$ or $V_{ss}$ and enters into high-impedance, or Hi-Z, state. A series resistors 140 of the output transistor operates to provides an improved ESD protection as well as dampens the output to minimize the ringing effect.

Figure 4A:
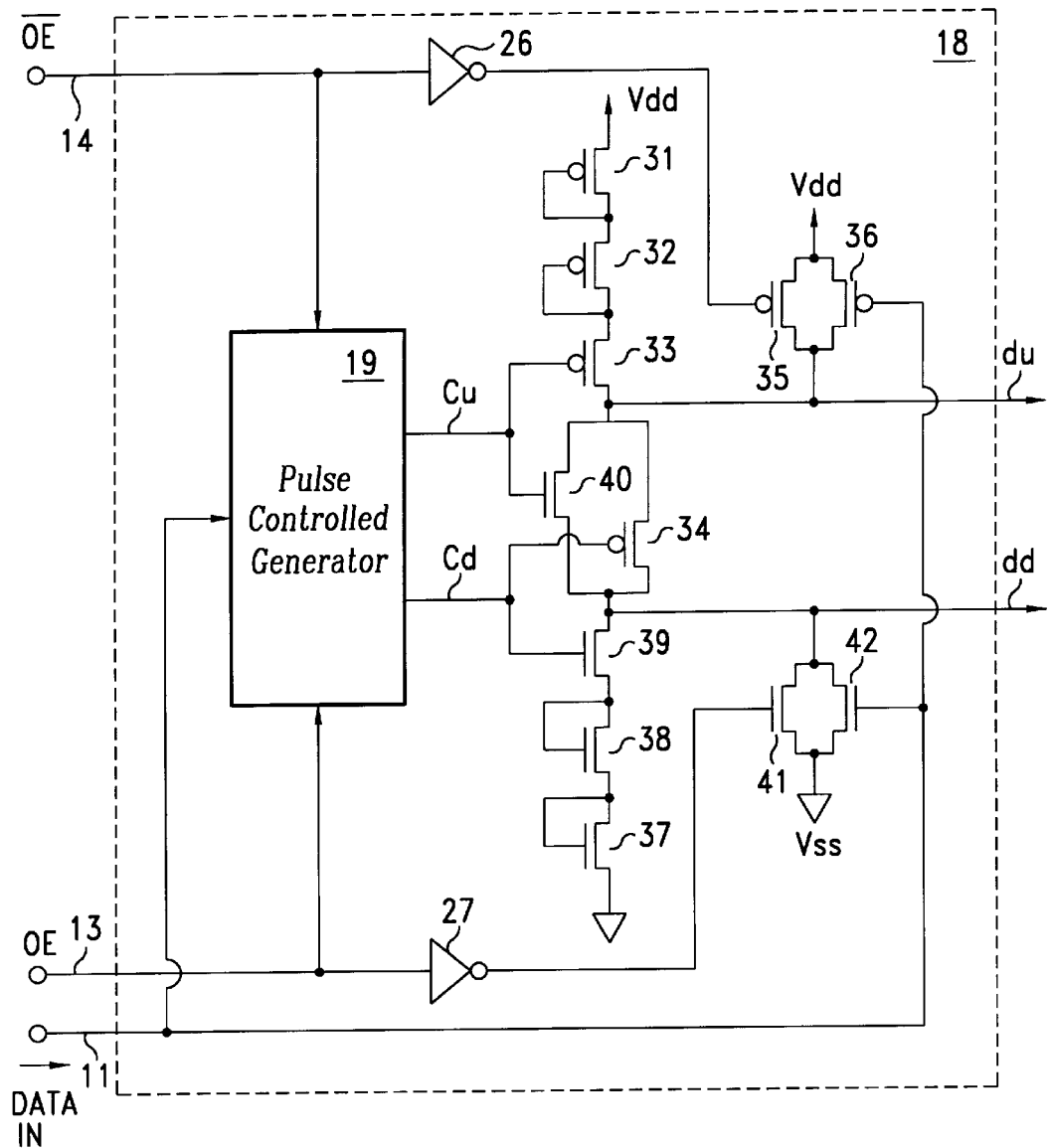
FIG. 4A shows the configuration of the predrive circuit.

Referring to FIG. 4A, there is shown a predrive circuit 18 to implement the controlled waveforms on terminal du and dd of the P-channel output transistor MPU and the N-channel output transistor MND. When output enable line (OE) 13 is held at a logic high state, the line 14 which is an inversion of the line 13 is held at a logic low state. The transistors 35 and 41 are at OFF states. When a logic data input 11 is switched from logic "1" state to logic "0" state, the P-channel transistor 36 is turned ON, and the N-channel transistor 42 is turned OFF. The terminal du of the P-channel output transistor MPU is pulled up to $V_{dd}$ via the transistor 36 to turn off the pull-up output transistor MPU. At this occurrence, the output signals of the pulse controlled generator 19, terminal Cu and Cd, are kept at logic high and low high states to turn on transistors 40, 34 and turn off transistor 33 and 39. The gate connected to the terminal dd is charged to the first voltage (e.g., $V_{dd}$) via transistor 36, 34 and 40 to turn on a pull-down N-channel output transistor MND.

After a predetermined time period 71, the pulse controlled generator 19 produces a pair of negative and positive pulses with a period 72 on terminal Cu and Cd to turn off transistors 40 and 34, and to turn on transistors 33 and 39. At the period 72, the signal du is kept at $V_{dd}$ and the pull-up P-channel output transistor MPU is turned off. The signal of the terminal dd is discharged from a first voltage (e.g., $V_{dd}$) to a second voltage value which is smaller than the first voltage and is determined by the diode-connected N-channel transistor 37 and 38. The diode-connected N-channel transistor 37 and 38 are used to decrease the voltage level from the first voltage value, e.g., Vdd, on terminal dd during the period 72. After the controlled pulse period 72, the transistor 39 turns off and the transistors 34 and 40 turn on again. The terminal dd is charged up to its first voltage value (e.g., $V_{dd}$) again.

When a logic data input 11 is switched from logic "0" state to logic "1" state, the transistor 36 is off and the transistor 42 is turned on. The terminals du and dd are discharged to ground, $V_{ss}$, initially. After a predetermined time period 73, the pulse controlled generator 19 produces a pair of negative and positive pulses with a duration 74 on its outputs, terminals Cu and Cd, to turn off the transistors 40 and 34, and to turn on the transistors 33 and 39. At the period 74, the terminals dd is kept at $V_{ss}$ and the pull-down N-channel output transistor MND is off, while the signal du is charged up from the first voltage (e.g., $V_{ss}$) to the second voltage which is larger than the first voltage and is determined by the power supply $V_{dd}$ and the diode-connected P-channel transistors 31 and 32. After this time period 74, the transistor 33 turns off and the transistors 34 and 40 turn on again. The terminal du is discharged to the first voltage value (e.g., $V_{ss}$) again. The diode-connected P-channel transistors 31 and 32 are used to increase the voltage level from the first voltage value, e.g. Vss, on the terminal du during the period 74. When the output enable terminal 13 is switched from a logic "1" state to a logic "0" state, the output enable inversion terminal 14 changes from logic "0" state to logic "1" state. At this occurrence, the output terminal Cu and Cd of the pulse controlled generator 19 switche from a high to low to turn off a transistor 40, and switches from low to high to turn off the transistor 34. The transistor 35 turns on to charge up the terminal du to $V_{dd}$. The transistor 41 turn on to pull down the terminal dd to $V_{ss}$. The pull-up P-channel output transistor MPU and the pull-down N-channel output transistor MND are turned off to tri-state the output node 12 to a High-impedance, Hi-Z, state.

Figure 4B:
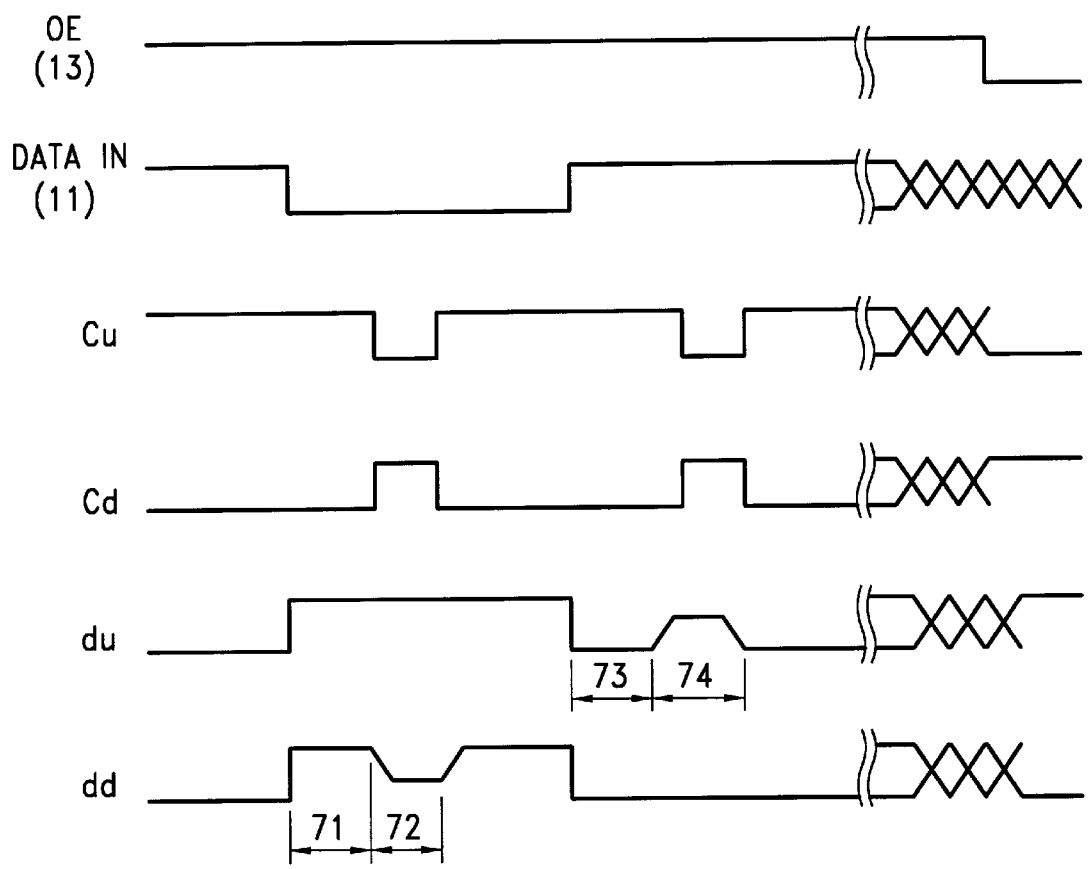
FIG. 4B is a timing waveform of the OE, DATA IN, Cu, Cd, du, and dd terminals.
Figure 4C:
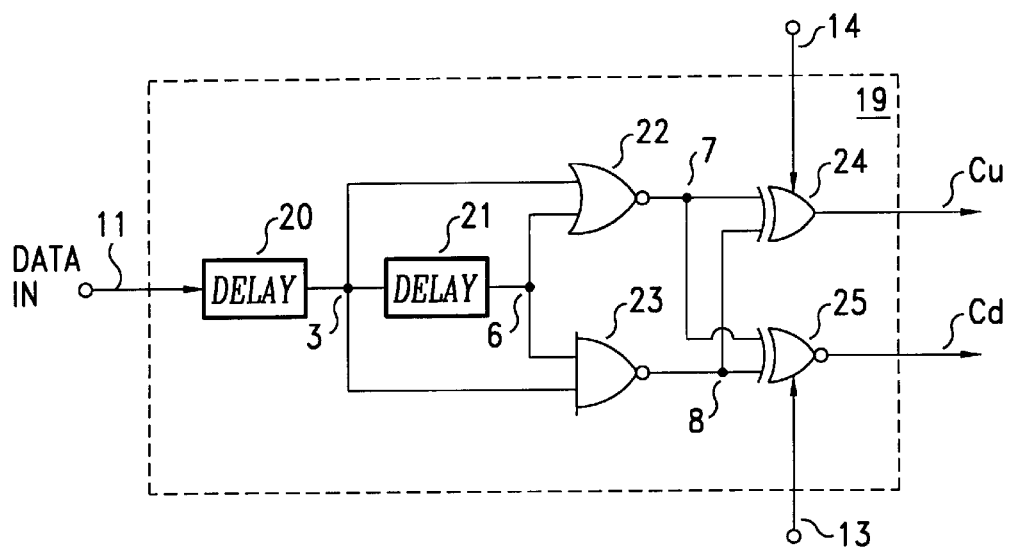
FIG. 4C shows the configuration of the pulse controlled generator included in the predrive circuit.

FIG. 4B is a timing waveform showing the operation of the predrive circuit 18 illustrated in FIG. 4A. Referring to FIG. 4C, the pulse controlled generator 19 shown in FIG. 4A is illustrated. The controlled elapsed time 71 and 73 are determined by the delay line circuit 20, and the duration of the controlled pulses 72 and 74 are determined by the delay line circuit 21. When a logic data input 11 is switched from logoc "1" state to logoc "0" state. After the predetermined time 71 which is determined by the delay line circuit 20, the node 3 changes the state from a low to a high state, then the node 8 changes a state from high to low and triggers the enable-controlled XOR 24 and XNOR 25 gates to change output states on the terminal Cu from high to low and the Cd from a low to a high state. After a predetermined time 72, a node 6 switches from high to low, then a node 8 changes from low to high and triggers the enable-controlled XOR 24 and XNOR 25 gates to change output states from low to high on the terminal Cu and high to low on the terminal Cd.

Figure 4D:
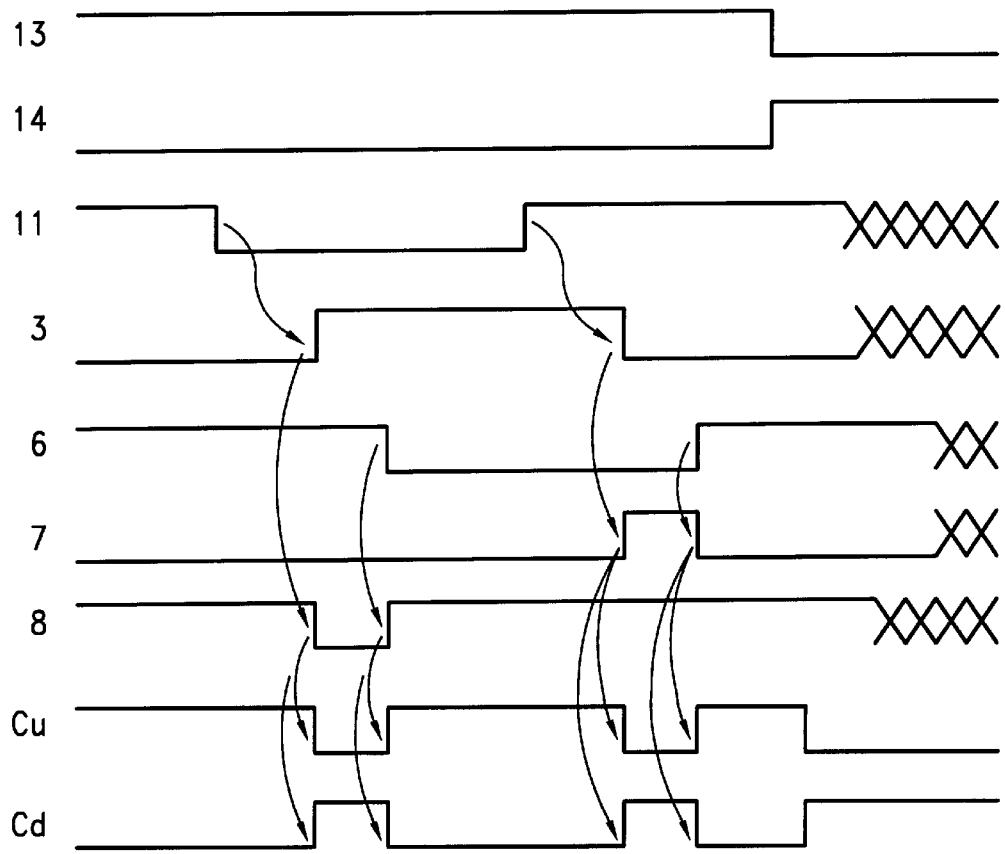
FIG. 4D shows the waveform of the Cu, Cd, 13, 14, 11, 3, 6, 7 and 8 terminals.
Figure 4E:
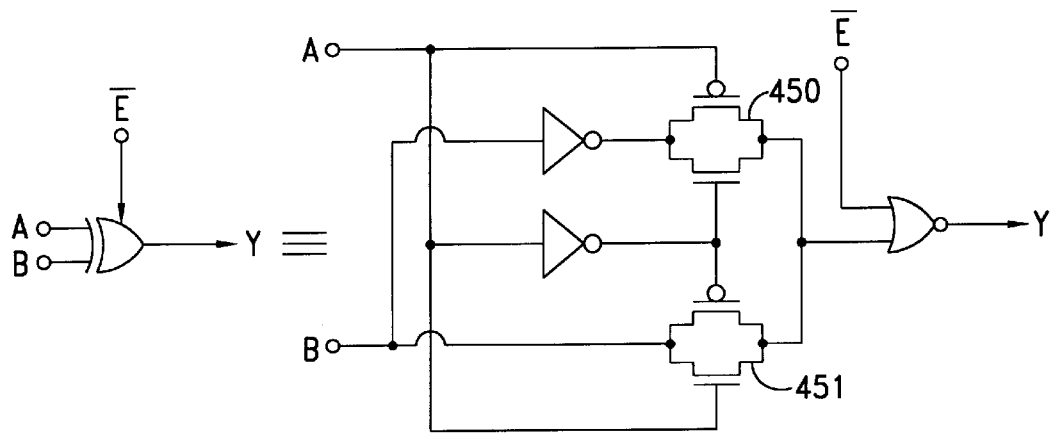
FIG. 4E shows the configuration of the enable-controlled EXCLUSIVE OR (XOR) operator.
Figure 4F:
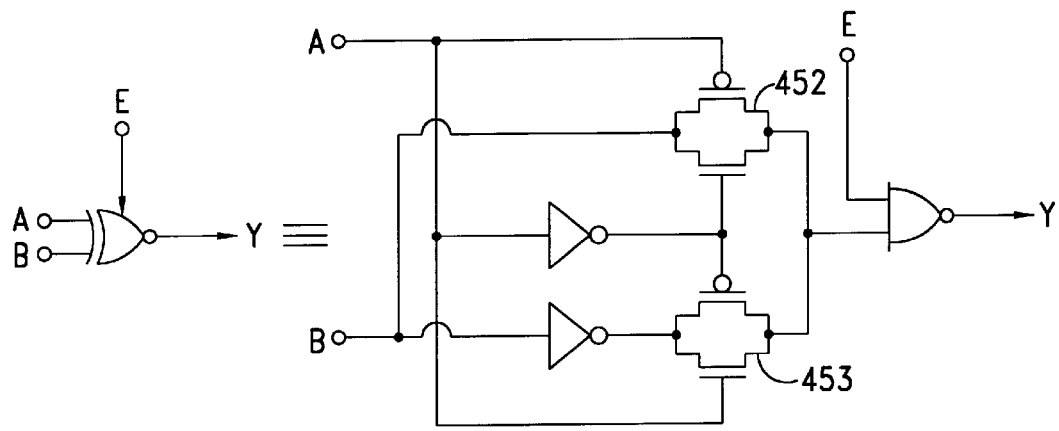
FIG. 4F shows the configuration of the enable-controlled EXCLUSIVE NOR (XNOR) operator.
Figure 4G:
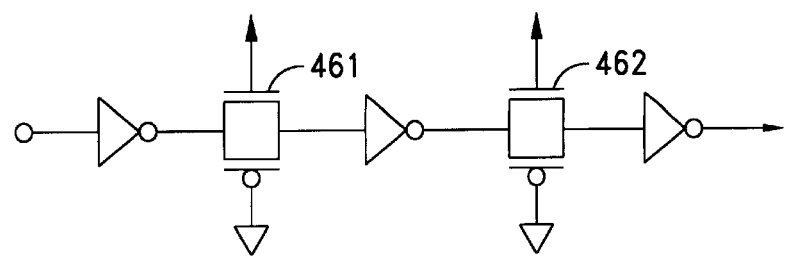
FIG. 4G shows the configuration of the delay line circuit.
Figure 4H:
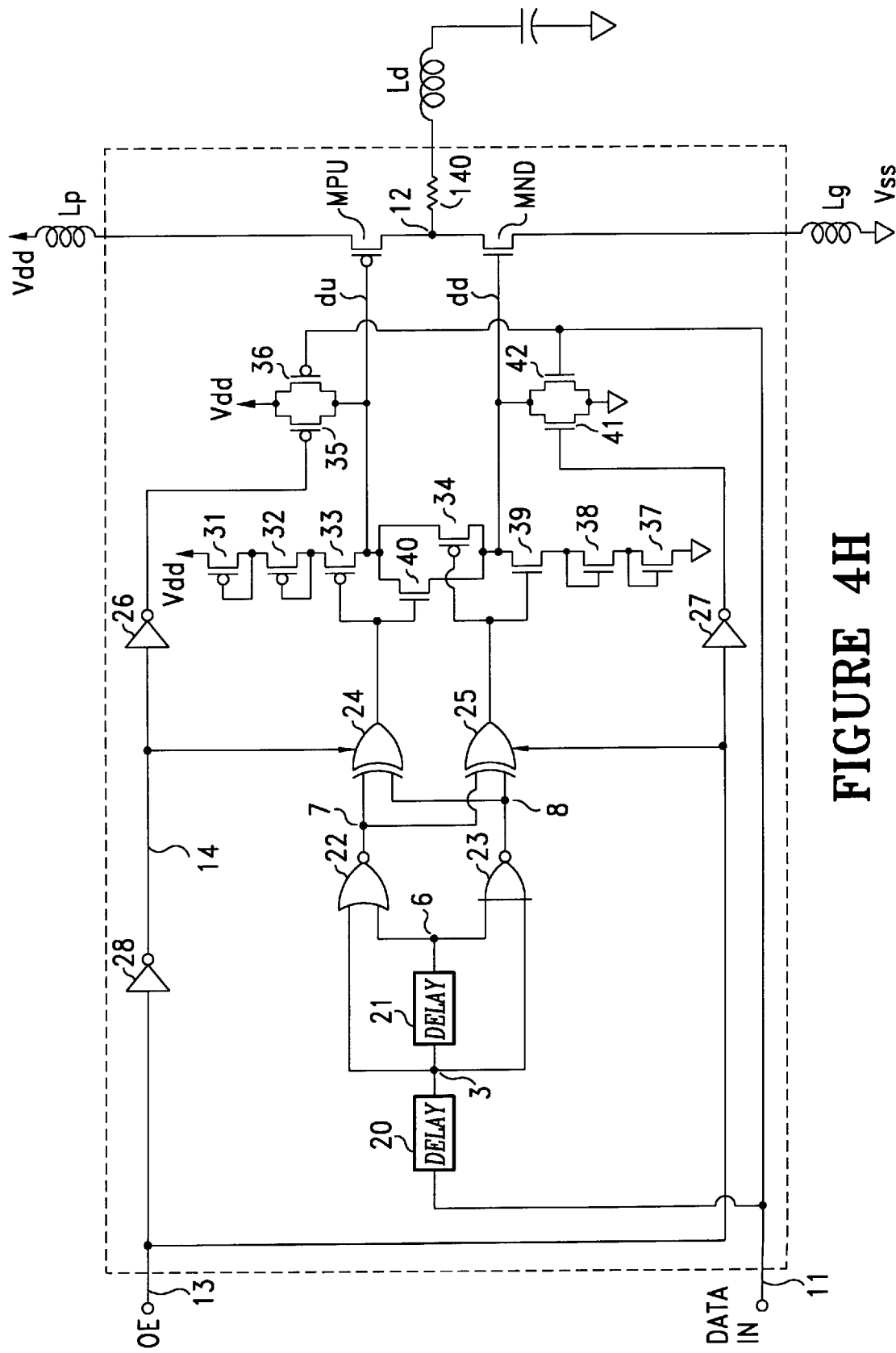
FIG. 4H shows detail circuit diagram of a CMOS output buffer of the present invention.

The similar operation happens when a logic data input 11 switches from logic "0" state to logic "1". The wave form chart illustrated in FIG. 4D shows the operation of the pulse controlled a generator 19 and the detail circuit diagrams of the enable-controlled XOR gate 24, the XNOR gate 25 and delay line circuits 20 and 21 are illustrated in FIG. 4E, FIG. 4F and FIG. 4G. The detail circuit diagram of a CMOS output buffer of the present invention is illustrated in FIG. 4H. The symbols in FIG. 4E and 4F represented by 450, 451, 452 amd 453 are transmission gate. The symbol in FIG. 4G, represented by 461 and 462 are tresmission gate.

Figure 3A:
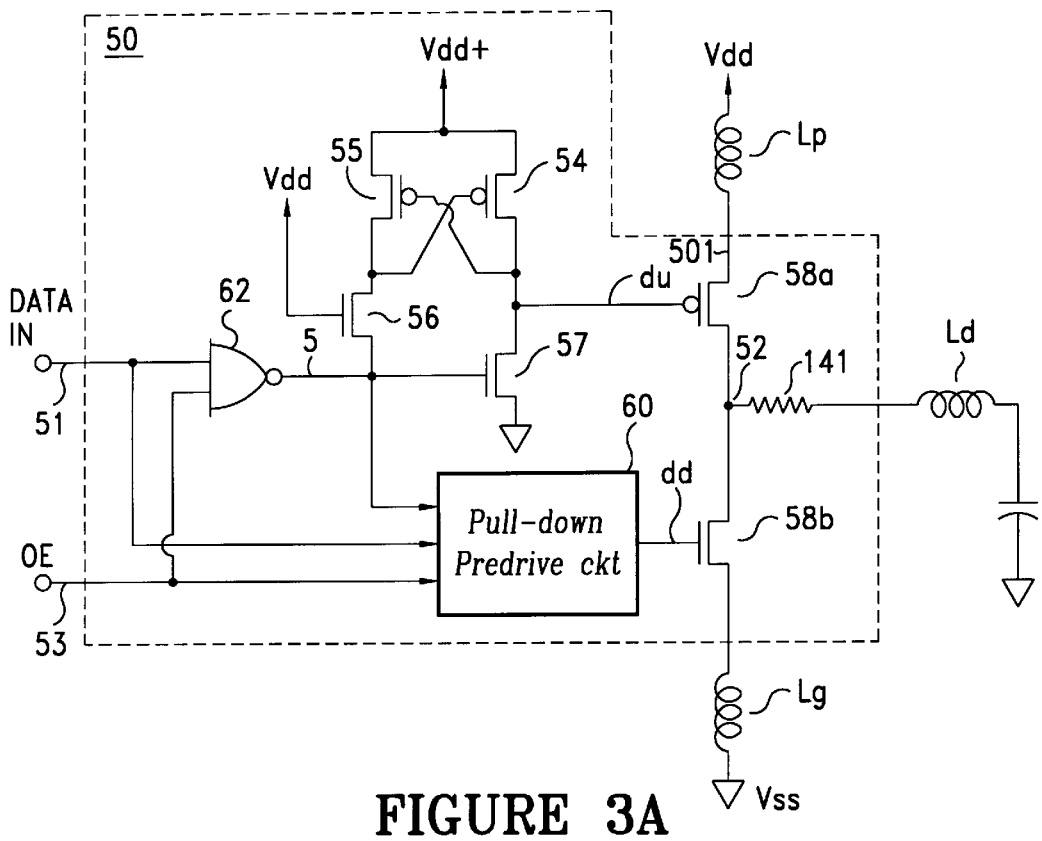
FIG. 3A shows an NMOS output buffer circuit of the present invention.

Referring to FIG. 3A, an NMOS output buffer circuit 50 of the present invention. A logic data input terminal 51 is the data output from a selected bit of a memory array. An output terminal 52 of the buffer circuit 50 is used to drive an output pad and pin of an integrated circuit package. A pair of N-channel output driver transistors, 58a and 58b, are used to drive the output terminal 52. The N-channel transistor 58a is a pull-up transistor and the 58b is a pull-down transistor. To produce a full $V_{dd}$ output high logic level at the output terminal 52, the pull-up N-channel output transistor 58a must receive a boosted gate voltage at gate du at least one transistor threshold value above $V_{dd}$ supply voltage, i.e., $V_{dd}+$. While the terminal dd is held at $V_{ss}$ to turn off N-channel pull-down transistor 58b. Transistors 54, 55, 56 and 57 consists of the $V_{dd}+$ level conversion circuit. When node 5 is at low logic level, e.g. Vss, the cross-couple PMOS transistor 54 would be ON, while transistor 55 would be OFF. The terminal du is charged to $V_{dd}+$ via a transistor 54. If the output terminal 52 is desired to be in a logic "0" state, a node 5 is at set at high logic level (e.g., $V_{dd}$). A transistor 57 would turn on and a gate du is discharged to $V_{ss}$. The cross-couple P-channel transistor 54 would turn off, while transistor 55 turns on.

Figure 3B:
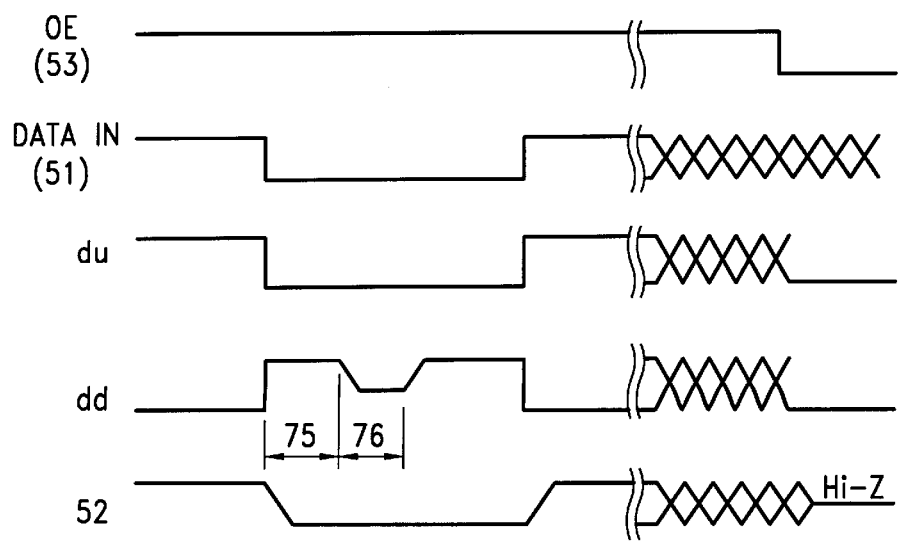
FIG. 3B shows the waveform of the OE, DATA IN, du, dd and 52 terminals.

The waveform of the output enable terminal 53 (OE), data input terminal 51 (DATA IN), du, dd and 52 terminals are shown in FIG. 3B. The pull-down predrive circuit 60 generates a first gate voltage (e.g., $V_{dd}$) on terminal dd for a predetermined time period 75, and further generates a second voltage value which is smaller than the first voltage. After a predetermined time 76, the terminal dd returns back to its first gate voltage, while the gate du is kept at $V_{ss}$ to turn off a pull-up N-channel transistor MNU. A series resistor 141 of the output transistors 58a and 58b provides a better ESD protection as well as helps damp the output to minimize the ringing effect. Besides, during the output transition from $V_{OL}$ to $V_{OH}$ when the pull-up N-channel transistor 58a is conductive, the resistor 141 provides a local negative feedback to control the source current from the source electrod, i.e., terminal 501, so the output pull-up slew rate is self-controlled. Thus the present invention eliminates the need to design a special circuitry to control the power bounce noise.

When an output enable terminal 53, OE, is switched from logic "1" state to logic "0" state to tri-state the buffer circuit 50, the pull-down predrive circuit 60 discharges the gate connected to a terminal dd and turns off the pull-down N-channel output transistor MND, and the node 5 of NAND gate 62 outputs high to turn on transistor 57, so a gate du is discharged to $V_{ss}$ and make the cross-couple P-channel transistor 54 off, and the transistor 55 to turn on. The pull-up N-channel output transistor MNU is at the off state. The output 52 is disconnected from a power supply $V_{dd}$ and a ground $V_{ss}$, and enters into a high-impedance, or Hi-z, state.

Figure 5A:
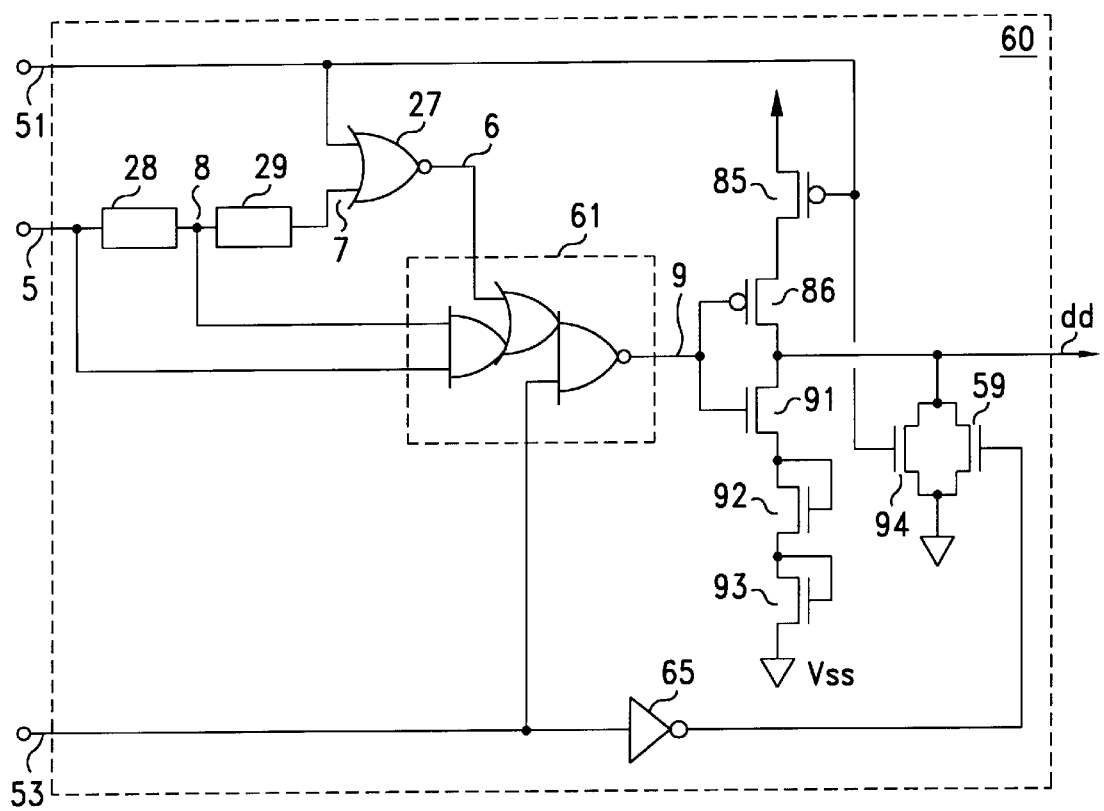
FIG. 5A shows the pull-down predrive circuit implemented in the controlled waveform of terminal dd of the N-channel pull-down transistor MND.

Referring to FIG. 5A, the pull-down predrive circuit 60 shown in FIG. 3A is illustrated to implemented the controlled wave form on the terminal dd of the N-channel pull-down transistor 58b for a NMOS output buffer circuit. When the buffer circuit outputs data, the output enable terminal 53 is kept at high state to turn off the transistor 59. If the data input terminal 51 is switched from logic "1" state to logic "0" state. A transistor 94 turns off, while a transistor 85 turns on. At this occurrence, the nose 5 changes the state from low state to high state, but the nodes 7 and 8 are still kept at high levels and the output terminal 6 of a NOR gate 27 is in low state. The complex AND-OR-NAND gate 61 discharges the node 9 to $V_{ss}$. The terminal dd is charged up to its first voltage (e.g., $V_{dd}$) via transistors 85 and 86.

After a predetermined time period 75 which is determined from a delay control circuit 28, a node 8 changes from high state to low state. The complex AND-OR-NAND gate 61 changes a state from low state to high state, a transistor 86 turns off, while a transistor 91 turns on. The terminal dd is discharged to the second voltage which is smaller than the first voltage value and is determined by the diode-connected N-channel transistors 92 and 93.

After the predetermined time 76 which is determined by a delay control circuit 29, the node 7 changes the state from high state to low state. The output 6 of the NOR gate 27 changes from low state to high state. The complex AND-OR-NAND gate 61 discharges the node 9 to $V_{ss}$. The transistor 91 turns off and the transistor 86 turns on again. The terminal dd returns back to its first voltage (e.g., $V_{dd}$) via the transistors 85 and 86.

If a data input terminal 51 is switched from logic "0" state to logic "1" state, the transistor 85 turns off. While the transistor 94 turns on to discharge the terminal dd to $V_{ss}$, the N-channel pull-down transistor MND is turned off first, then the output 6 of the NOR gate 27 is switched from high state to low state. The complex AND-OR-NAND gate 61 charges the node 9 to $V_{dd}$ to turn off the transistor 86, thus there is no conducting path between the node dd and the power supply $V_{dd}$.

When the output enable signal 53, OE, changes from high state to a low state, the transistor 59 turns on to discharge the terminal dd to $V_{ss}$. The N-channel pull-down transistor MND is turned off first, then the complex AND-OR-NAND gate 61 charges the node 9 to $V_{dd}$ to turn off the transistors 86. There is no conducting path between the termianl dd and the power supply $V_{dd}$.

Figure 5B:
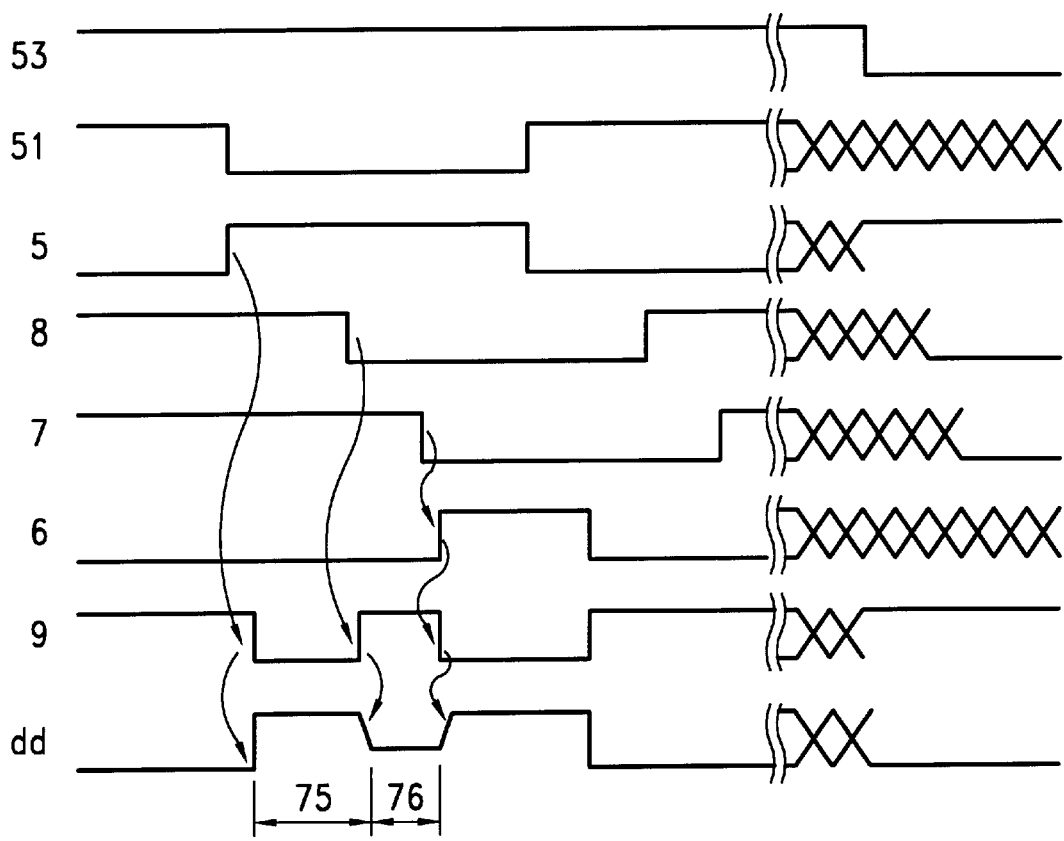
FIG. 5B is a waveform chart showing the operation of the pull-down predrive circuit.
Figure 5C:
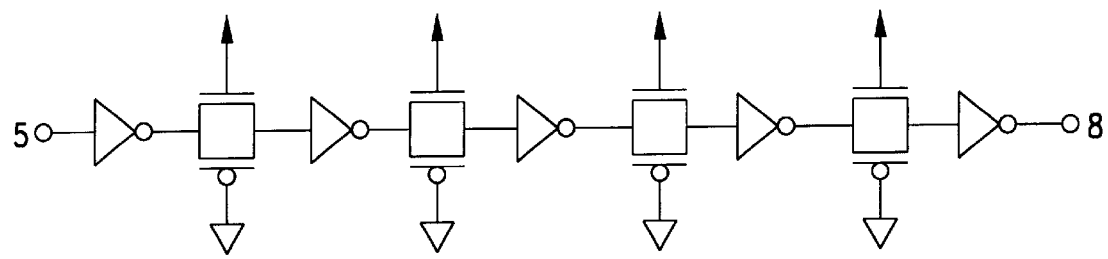
FIG. 5C and FIG. 5D are detail circuits which show the specific configuration of the delay control circuits.
Figure 5D:
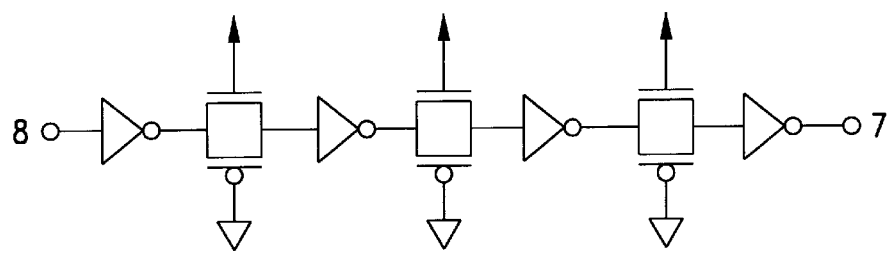
Figure 5E:
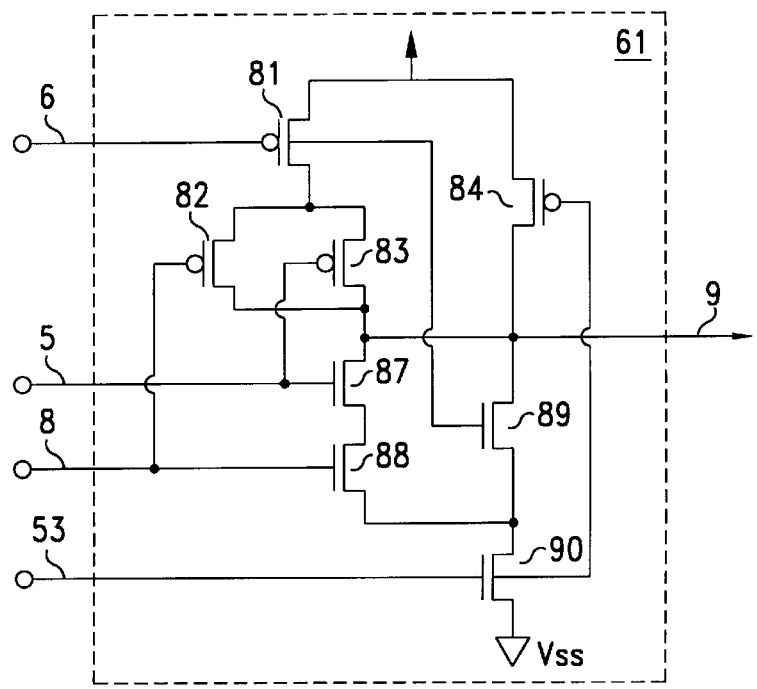
FIG. 5E is the detail circuit which shows the specific configuration of the AND-OR-NAND gate 61 FIG. 5A.
Figure 5F:
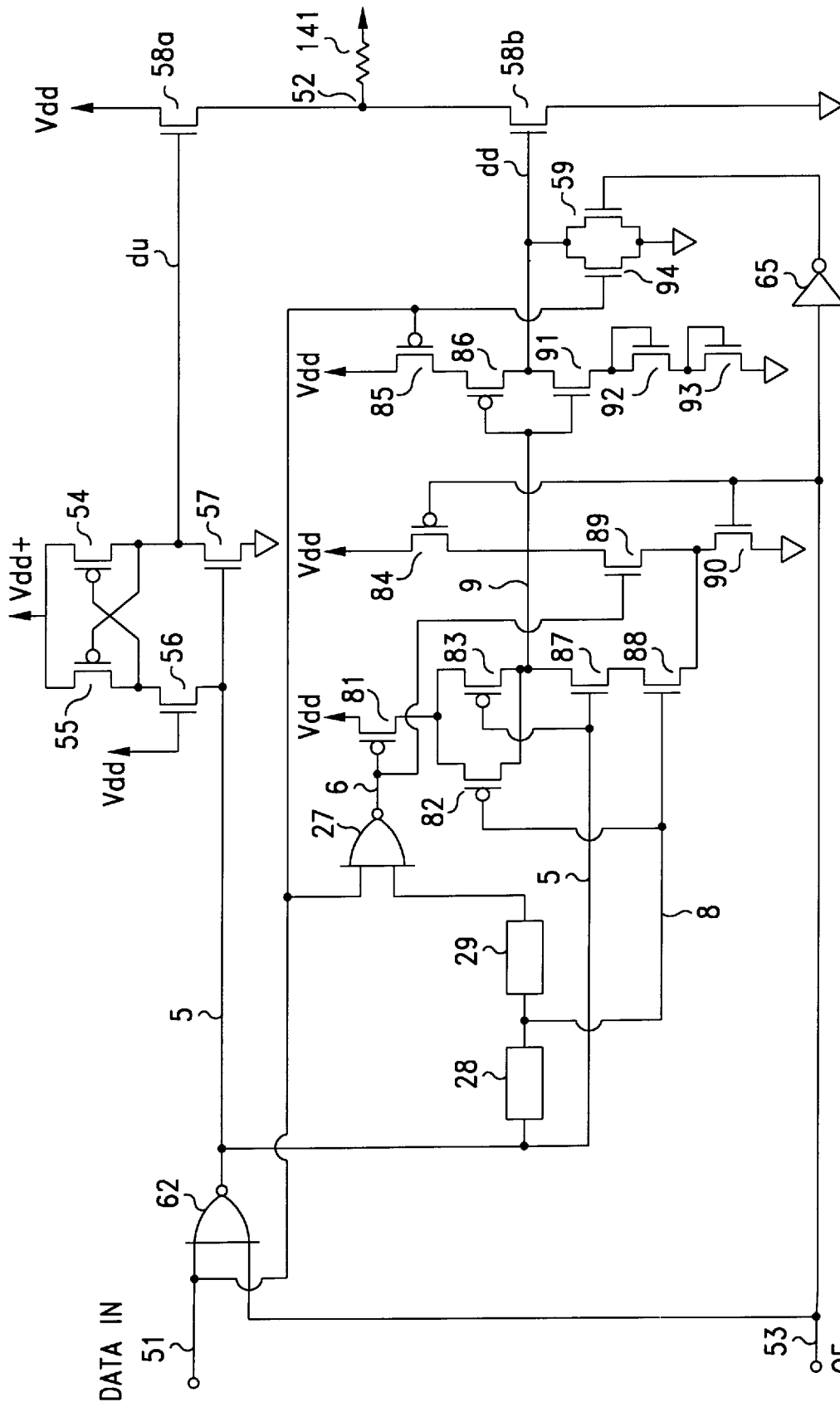
FIG. 5F is a detail circuit diagram of a NMOS output buffer circuit of the present invention.

FIG. 5B is a waveform showing the operation of the pull-down predrive circuit 60 illustrated in FIG. 5A. FIG. 5C and FIG. 5D are detail circuits which show the specific configuration of the delay control circuits 28 and 29 in FIG. 5A. FIG. 5E is the detail circuit which shows the specific configuration of the complex AND-OR-NAND gate 61 in FIG. 5A. FIG. 5H is a detail circuit diagram of a NMOS output buffer circuit of the present invention.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A semiconductor device comprising:
    a first transistor having a first terminal, a second terminal connected to a data output signal, and a third terminal connected to a first voltage of a first supply;
    a second transistor having a first terminal, a second terminal connected to said data output signal and said second terminal of said first transistor, and a third terminal connected to a second voltage of a second supply; and,
    predriving means received an input data signal and coupled to said first terminal of said first transistor and said first terminal of said second transistor for generating a first control signal and a second control signal to said first terminals, respectively, said first control signal being used to extend a duration of a saturation region of said first transistor when said data output signal changes from a first voltage level to a second voltage level, said second control signal being used to extend a duration of a saturation region of said second transistor when said data output signal changes from said second voltage level to said first voltage level, said data output signal being at said first voltage level for a first period, said data input signal being at said voltage level for a second period.

2. The semiconductor device as claim 1, wherein said first control signal changes from said second voltage level to a raised voltage level for a short period within said second period, and said second control signal changes from said first voltage level to a lowered voltage level for said short period within said second period.

3. A method for reducing ground bounce in a semiconductor device, comprising the steps of:
    providing a first transistor and a second transistor coupled in series, a first supply voltage and a second supply voltage;
    generating a first control signal, during a first control phase, to extend a first duration of said first transistor in saturation when an input signal changes from a first voltage level to a second voltage level, said first transistor being driven to a conducting state, said second transistor being driven to a nonconductive state, said first transistor in said conducting state remaining in saturation as an output voltage at a node between said first transistor and said second transistor decreases until said output voltage is smaller than a $V_{gs} - V_{tn}$ value, where $V_{gs}$ denotes the gate to source voltage and $V_{tn}$ denotes the threshold voltage;
    altering said first control signal from said second voltage level to a reduced voltage level for a short period within said first control phase;
    generating a second control signal, during a second control phase, to extend a second duration of said second transistor in saturation when an input signal changes from said second voltage level to said first voltage level, a gate voltage of said second transistor being reduced, a gate-to-source voltage of said first transistor being reduced;
    altering said first control signal from said first voltage level to a raised voltage level for a short period within said second control phase; and,
    regaining the gate voltage of said second transistor to the first voltage level during a third control phase.

4. The method of claim 3, wherein altering said first control signal comprising the step of raising the raised voltage from said second voltage level.

5. The method of claim 3, wherein altering said second control signal comprising the step of reducing the reduced voltage from said first voltage level.

6. A semiconductor device comprising:

a first transistor having a first terminal, a second terminal connected to a data output signal, and a third terminal connected to a first voltage of a first supply;

a second transistor having a first terminal, a second terminal connected to said data output signal and said second terminal of said first transistor, and a third terminal connected to a second voltage of a second supply;

predriving means received an input data signal and coupled to said first terminal of said first transistor and said first terminal of the second transistor for generating a first control signal and a second control signal to said first terminals, respectively, said first control signal being used to extend a duration of a saturation region of said first transistor when said data output signal changes from a first voltage level to a second voltage level, said second control signal being used to extend a duration of a saturation region of said second transistor when said data input signal being at said first voltage level for a first period, said data input signal being at said voltage level for a second period, wherein said predriving means further includes:

a pulse controlled generator for generating a plurality of negative pulses and a plurality of positive pulses;

voltage reducing means for reducing voltage from said first voltage level;

voltage raising means for raising voltage from said second voltage level; and switching means for generating said first control signal and said second control signal, said switching means connecting said voltage reducing means and said voltage raising means to the gates of said first transistor and said second transistor according to said plurality of negative pulses and said plurality of positive pulses, said switching means connecting said first supply and said second supply to the gates of said first transistor and said second transistor respectively according to said plurality of negative pulses and said plurality of positive pulses.

7. The semiconductor device as claim 6, wherein said voltage reducing means is a plurality of diode connected transistors.

8. The semiconductor device as claim 6, wherein said voltage raising means is a plurality of diode connected transistors.

9. The semiconductor device as claim 6, wherein said pulse controlled generator includes:

first delay means for delaying said data input signal for a first time interval;

second delay means for delaying the output signal of said first time delay means;

a NOR gate for generating a plurality of unit positive pulses according to the output signal of said first time delay means and said second time delay means;

a NAND gate for generating a plurality of unit negative pulses according to the output signal of said first time delay means, said second time delay means and an output enable signal;

an EXCLUSIVE OR gate for generating said plurality of negative pulses according to said plurality of unit positive pulses, said plurality of unit negative pulses and said output enable signal; and an EXCLUSIVE NOR gate for generating said plurality of positive pulses according to said plurality of unit positive pulses, said plurality of unit negative pulses and inversion result of said output enable signal.

* * * * *

UNITED STATES PATENT AND TRADEMARK OFFICE
CERTIFICATE OF CORRECTION

PATENT NO. : 6,166,582
DATED : December 26, 2000
INVENTOR(S) : J.-C. Tseng et al.

It is certified that error appears in the above-identified patent and that said Letters Patent is hereby corrected as shown below:

Title page,
Column 2, Item [57], Abstract
Lines 13-16, "The steep rising gate voltave on the N-channel output transistor can be a voided with a very little speed degradation but instead of better  ground bounce improvement." should read
-- the steep rising gate voltage on the N-channel output transistor can be avoided with very little speed degradation resulting in better ground bounce improvement --

Column 8 (claim 2, line 1),
Line 29, "as" should read -- of --

Column 8 (claim 3, line 16),
Line 51, "gate to source" should read -- gate-to-source --

Column 9 (claim 4, line 2),
Line 2, "comprising" should read -- comprises --

Column 9 (claim 5, line 2),
Line 5, "comprising" should read -- comprises --

Column 10 (claim 7, line 1),
Line 10, "as" should read -- of --

Column 10 (claim 8, line 1),
Line 13, "as" should read -- of --

UNITED STATES PATENT AND TRADEMARK OFFICE
CERTIFICATE OF CORRECTION

PATENT NO. : 6,166,582
DATED : December 26, 2000
INVENTOR(S) : J.-C. Tseng et al.

It is certified that error appears in the above-identified patent and that said Letters Patent is hereby corrected as shown below:

Column 10 (claim 9, line 1),
Line 16, "as" should read -- of --

Signed and Sealed this

Second Day of October, 2001

Attest:

*Nicholas P. Godici*

NICHOLAS P. GODICI
*Attesting Officer*     *Acting Director of the United States Patent and Trademark Office*